(12) United States Patent
Tsukada

(10) Patent No.: US 7,759,708 B2
(45) Date of Patent: Jul. 20, 2010

(54) SOLID-STATE IMAGING APPARATUS

(75) Inventor: Atsushi Tsukada, Kanagawa (JP)

(73) Assignee: Sony Corporation, Tokyo (JP)

( * ) Notice: Subject to any disclaimer, the term of this patent is extended or adjusted under 35 U.S.C. 154(b) by 250 days.

(21) Appl. No.: 11/743,971

(22) Filed: May 3, 2007

(65) Prior Publication Data

US 2007/0267661 A1 Nov. 22, 2007

(30) Foreign Application Priority Data

May 17, 2006 (JP) .................... P2006-137368

(51) Int. Cl.
*H01L 27/146* (2006.01)
(52) U.S. Cl. ............... 257/232; 257/229; 257/E31.097
(58) Field of Classification Search ................... 522/79, 522/114; 257/232
See application file for complete search history.

(56) References Cited

U.S. PATENT DOCUMENTS 5,530,036 A * 6/1996 Sano et al. .................... 522/79

FOREIGN PATENT DOCUMENTS

| JP | 61-144031 | | 7/1986 |
| JP | 62-264659 | | 11/1987 |
| JP | 07-183415 | * | 2/1988 |
| JP | 6-21414 | | 1/1994 |
| JP | 07-183415 | | 7/1995 |
| JP | 63-043353 | * | 7/1995 |
| JP | 08-083859 | | 3/1996 |
| JP | 08-204048 | | 8/1996 |
| JP | 63-043353 | | 2/1998 |
| JP | 2001-118967 | | 4/2001 |
| JP | 2002-57311 | | 2/2002 |
| JP | 2002-329850 | | 11/2002 |
| JP | 2004-296740 | | 10/2004 |
| JP | 2005-072364 | | 3/2005 |
| WO | 2006/040986 | | 4/2006 |

* cited by examiner

*Primary Examiner*—Jerome Jackson, Jr.
*Assistant Examiner*—Dale Page
(74) *Attorney, Agent, or Firm*—K&L Gates LLP

(57) ABSTRACT

A solid-state imaging apparatus is provided. The solid-state imaging apparatus includes a solid-state imaging device, an α-ray shielding layer formed so as to cover at least an imaging area of the solid-state imaging device and a cover glass provided above the α-ray shielding layer.

14 Claims, 5 Drawing Sheets

SOLID-STATE IMAGING APPARATUS

CROSS REFERENCES TO RELATED APPLICATIONS

The present applications claims priority to Japanese Patent Application JP 2006-137368 filed in the Japan Patent Office on May 17, 2006, the entire contents of which is being incorporated herein by reference.

BACKGROUND

The present disclosure relates to a solid-state imaging apparatus and in particular, to a solid-state imaging apparatus installed with a solid-state imaging device such as a CCD (charge coupled device) sensor and a CMOS sensor using a CMOS (complementary metal oxide semiconductor) transistor as a pixel.

FIG. 5 is a schematic cross-sectional view of a solid-state imaging apparatus of the related art disclosed in, for example, JP-A-2002-057311.

For example, a solid-state imaging device 101 such as a CCD sensor and a CMOS sensor is mounted within a recess 100a of a package 100, and necessary wiring is performed by non-illustrated wire bonding or the like.

A color filter 102 is provided on the foregoing solid-state imaging device 101.

Furthermore, a cover glass 103 for protecting the solid-state imaging device 101 and the color filter 102 so as to cover and seal the recess 100a of the package 100.

As described above, a hollow portion 104 is configured by the cover glass 103 and the recess 100a of the package 100, and a solid-state imaging apparatus is mounted within the hollow portion 104 and sealed therein.

In the solid-state imaging apparatus according to the foregoing related art, since radioactive elements such as U (uranium) and Th (thorium) are usually contained in an amount of from 0.1 ppm to 1 ppm in the cover glass 103, there is a problem that the solid-state imaging device 101 is influenced by a crystal defect or the like due to radioactive rays emitted from these elements, especially α-rays 105.

When the α-rays are irradiated on the solid-state imaging device, an energy loss process of α-rays is classified into an electronic energy loss and a nuclear energy loss.

When the energy of α-rays is defined as E, a pair of hole and electron is generated in the number of $(n \approx E/3.6 \text{ eV})$ in the electronic energy loss.

In the case of a solid-state imaging device, an instantaneous dark current spike is generated from a pixel due to this charge.

Next, though a crystal defect is generated in the nuclear energy loss, this crystal defect generates a defect level in silicon. In the case of a solid-state imaging device, a dark current in a pixel and a transfer part is increased.

With respect to a stored charge-output signal voltage conversion efficiency ($\eta$) of the solid-state imaging device, ($\eta$=5 to 20 μV/e) is realized. When $\eta$=10 μV/e, an image defect (point defect) is confirmed at from approximately $10^2$ e (number of generated electrons) at the time of a field storage (1/60 seconds).

Furthermore, the solid-state imaging device has activation energy of from 0.5 to 0.8 eV due to the energy level of the defect, and the foregoing influence becomes remarkable at the time of high-temperature use.

As the influence of α-rays against, for example, a semiconductor memory, there is known a memory malfunction (software error) caused due to a charge generated by α-rays as described previously.

The software error requires a charge of $10^6$ e (number of generated electrons), and there is a difference of from approximately $10^3$ to $10^4$ times of the number of generated electrons to be confirmed as an image defect (point defect) in a solid-state imaging apparatus.

Since the higher the incident energy of α-rays (from 4 to 9 MeV in a radioactive isotope contained in a material), the more the influence of the software error, a protection structure for decaying the incident energy is effective.

In contrast thereto, in the solid-state imaging device, with respect to its permanent damage, when a depth of a sensor part is approximately 3 μm, the nuclear energy loss becomes the maximum at α-rays of incident energy of approximately 500 keV, the influence of incident α-rays at low energy is very large, and the solid-state imaging device is of an optical input. Accordingly, there are restrictions in the surface protection structure, and a countermeasure to α-rays of the cover glass is important.

In view of the foregoing problems, by realizing a high purity of a raw material of the cover glass 103, thereby decreasing the concentration of U and Th to approximately 30 ppb, it is possible to suppress an influence such as a crystal defect caused due to α-rays. However, the costs of the cover glass become very high.

JP-A-6-021414 is also exemplified as a related art.

SUMMARY

It is desirable to provide a solid-state imaging apparatus capable of decreasing an influence caused due to α-rays from a cover glass, reducing the costs of the cover glass and improving the reliability.

A solid-state imaging apparatus according to an embodiment includes a solid-state imaging device, an α-ray shielding layer formed so as to cover at least an imaging area of the solid-state imaging device and a cover glass provided above the α-ray shielding layer.

The foregoing solid-state imaging apparatus of the embodiment has a configuration in which an α-ray shielding layer is formed so as to cover an imaging area of a solid-state imaging device and a cover glass is provided thereabove.

In accordance with the solid-state imaging apparatus of the embodiment, an α-ray shielding layer is formed so as to cover an imaging area of a solid-state imaging device; an influence caused due to α-rays from a cover glass can be decreased so that it may not be necessary to reduce the concentration of U and Th contained in the cover glass; and a cheap usual cover glass can be used.

Additional features and advantages are described herein, and will be apparent from, the following Detailed Description and the figures.

DETAILED DESCRIPTION

Embodiments of a solid-state imaging apparatus are explained in detail below with reference to the accompanying drawings.

First Embodiment

Figure 1:
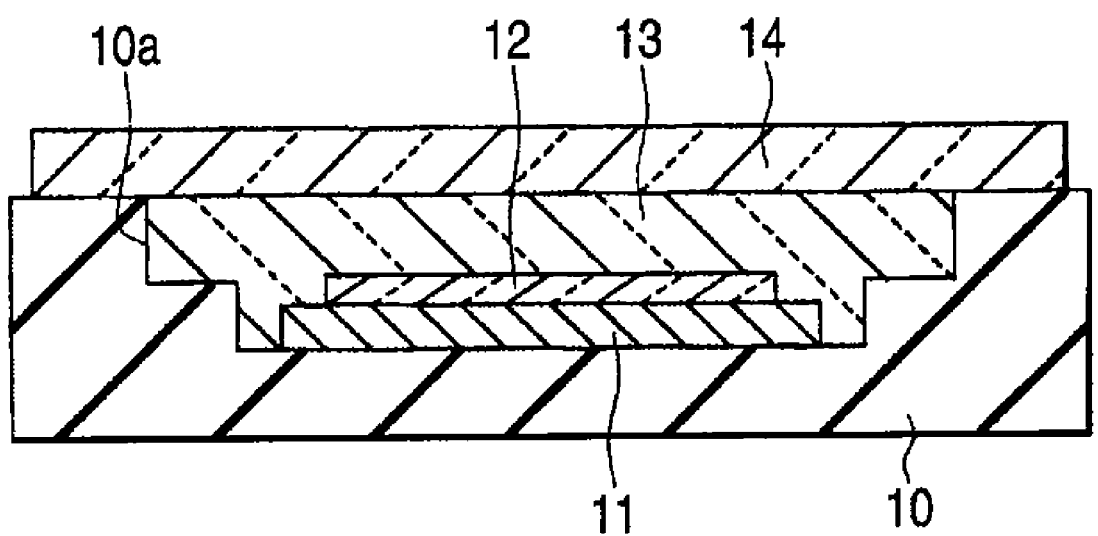
FIG. 1 is a schematic cross-sectional view of a solid-state imaging apparatus according to a First Embodiment.

FIG. 1 is a schematic cross-sectional view of a solid-state imaging apparatus according to a First Embodiment.

A solid-state imaging apparatus according to the present First Embodiment includes, for example, a solid-state imaging device 11, an α-ray shielding layer 13 formed so as to cover at least an imaging area of the solid-state imaging device 11, and a cover glass 14 provided above the α-ray shielding layer 13.

Examples of the solid-state imaging device 11 include a CCD sensor, a CMOS sensor, an area sensor, and a linear sensor. This solid-state imaging device 11 may be disposed either one-dimensionally or two-dimensionally.

The solid-state imaging device 11 is arranged and mounted within a recess 10a of a package 10 made of, for example, a resin, and necessary wiring is performed by non-illustrated wire bonding or the like.

The α-ray shielding layer 13 is a layer having an ability to shield α-rays and is, for example, formed so as to bury the recess 10a therein while covering the whole of the solid-state imaging device 11.

Also, in order to have an ability to shield α-rays, it is preferable that the α-ray shielding layer 13 is made of, for example, a substance having a density of 1.0 g/cm$^3$ or more.

The α-ray shielding layer 13 is preferably substantially transmissive against light of, for example, a visible region of light wavelength, and more preferably has a transmittance of 90% or more against light of a visible region of light wavelength.

Also, the α-ray shielding layer 13 preferably has adhesiveness to the cover glass 14 provided, for example, above the α-ray shielding layer 13.

As a material for constituting the α-ray shielding layer 13, which meets the foregoing various conditions simultaneously and which is free from a substance of emitting radioactive rays, resins can be preferably used.

Examples of the resin which can be used include an epoxy resin, an acrylic resin, and a silicone resin. These resins can be used singly or in admixture.

As the foregoing resin, for example, a thermocurable resin, an ultraviolet ray curable resin, and a two-pack mixed curable resin can be used. In particular, an ultraviolet ray curable resin is preferable because it is able to form a targeted gap structure within a short period of time. In the case where high reliability is required as in an onboard application, it is especially preferred to use a thermocurable resin.

As a gap forming method, a method of forming a gap structure beforehand on a cover glass or wafer surface can be employed. Examples of the gap structure as referred to herein include a dry film and a thick resist.

Each of the foregoing resins has a density of approximately 1.1 g/cm$^3$.

Though the α-ray shielding layer 13 made of the foregoing resin has an ability to shield α-rays, for the purpose of having a sufficient α-ray shielding ability, it is preferable that the α-ray shielding layer 13 has a thickness of, for example, 20 μm or more.

Also, the α-ray shielding layer 13 made of the foregoing resin has a transmittance against light of a visible region of light wavelength of 90% or more, for example, in a thickness to be employed in the present First Embodiment and is substantially transmissive.

Each of the foregoing resins has sufficient adhesiveness to the cover glass 14.

Since the foregoing α-ray shielding layer 13 is mediated between the cover glass 14 and the solid-state imaging device 11, even when an α-decaying element such as U (uranium) and Th (thorium) is contained in the cover glass 14, the α-ray shielding layer 13 shields α-rays emitted therefrom, whereby the amount of α-rays reaching the solid-state imaging device 11 can be largely decreased.

As described previously, since the α-ray shielding layer 13 is formed so as to cover an imaging area of the solid-state imaging device 11, the generation of a defect caused upon exposure of the imaging area of the solid-state imaging device 11 to α-rays can be inhibited.

In the solid-state imaging apparatus according to the First Embodiment, the cover glass 14 is, for example, provided so as to seal the recess 10a as an upper layer of the α-ray shielding layer 13 buried within the recess 10a of the package 10.

The glass is hard, and durable, dusts or the like attached onto a surface thereof can be easily wiped off, and the solid-state imaging device within the package can be protected.

As the cover glass 14, for example, a borosilicate glass, a quartz glass, an alkali-free glass, and a heat resistant glass are suitably used.

Also, an IR cut filter or a quartz low pass filter may also be used in place of the cover glass.

A thickness of the cover glass 14 is from 0.1 mm to 2 mm, and preferably from 0.3 mm to 0.7 mm.

In the case where a high-purity material is not used for the cover glass 14, the concentration of U and Th each of which is a radioactive element becomes high as 30 ppb or more.

Also, in the solid-state imaging apparatus of the present First Embodiment, for example, a color filter 12 for reading out a color is provided on the surface of the solid-state imaging device 11 and in a lower layer of the α-ray shielding layer 13.

In the solid-state imaging apparatus according to the present First Embodiment, when a cover glass not using a high-purity raw material is used, the quantity of α-rays emitted from the cover glass becomes large. For example, when an α-ray shielding layer having a thickness of 20 μm or more and made of a resin which is free from a substance emitting radioactive rays and which is transparent against visible light is provided between the cover glass and the solid-state imaging device, the α-ray shielding layer is able to decay the quantity of α-rays emitted from the cover glass and to decrease largely the quantity of α-rays reaching the solid-state imaging device, whereby the generation of a defect caused upon exposure of the imaging area of the solid-state imaging device to α-rays can be inhibited.

Also, as described previously, since it is enough that a high-purity raw material is not used as the cover glass, a cover glass made of a cheap material can be employed.

In the light of the above, the present First Embodiment is to provide a solid-state imaging apparatus with improved reliability while reducing the costs.

Example 1

Figure 2:
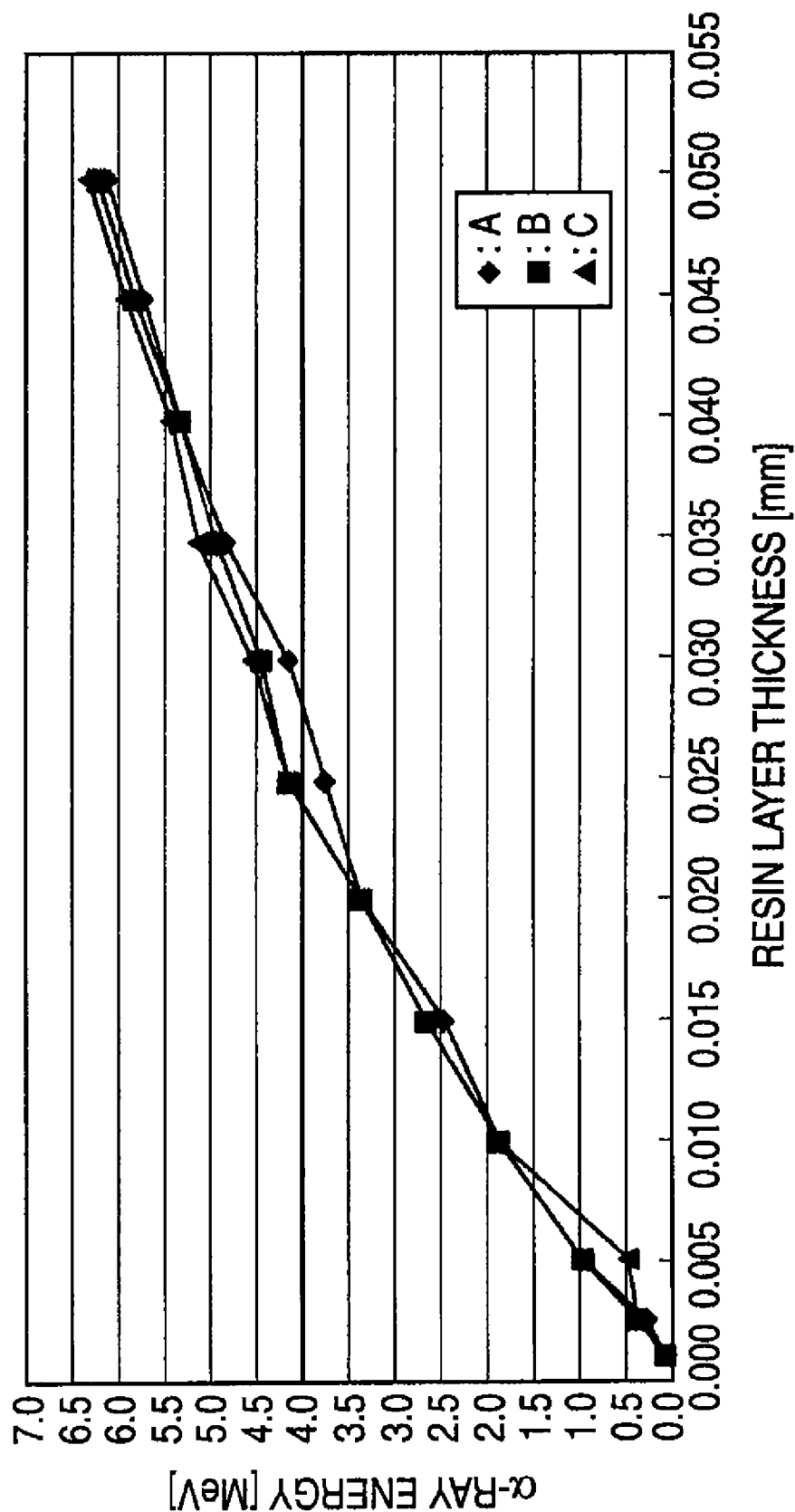
FIG. 2 is a graph showing an α-ray shielding ability of a resin as an α-ray shielding layer to be used in a solid-state imaging apparatus according to Example 1.

FIG. 2 is a graph to show an α-ray shielding ability of a resin as an α-ray shielding layer to be used in a solid-state imaging apparatus according to Example 1.

In FIG. 2, the abscissa stands for a resin layer thickness of a resin; and the ordinate stands for α-ray energy. With respect to three kinds of resins A, B and C each having a density of 1.1 g/cm$^3$, a resin layer thickness at which the α-rays of each energy can be substantially shielded was determined by simulation.

It was confirmed that the energy of α-rays which can be substantially shielded becomes large with an increase in the layer thickness and that the α-rays can be largely shielded at a layer thickness of approximately 20 μm or more.

The α-ray energy of U (uranium) is 4.2 MeV, and when a layer thickness at which the α-rays of this energy can be shielded was read out from the graph. As a result, it was found to be 25 μm or more.

The α-ray energy of Th (thorium) is 4.0 MeV, and a layer thickness at which the α-rays of this energy can be shielded was read out from the graph. As a result, it was found to be 23 μm or more.

Example 2

Figure 3:
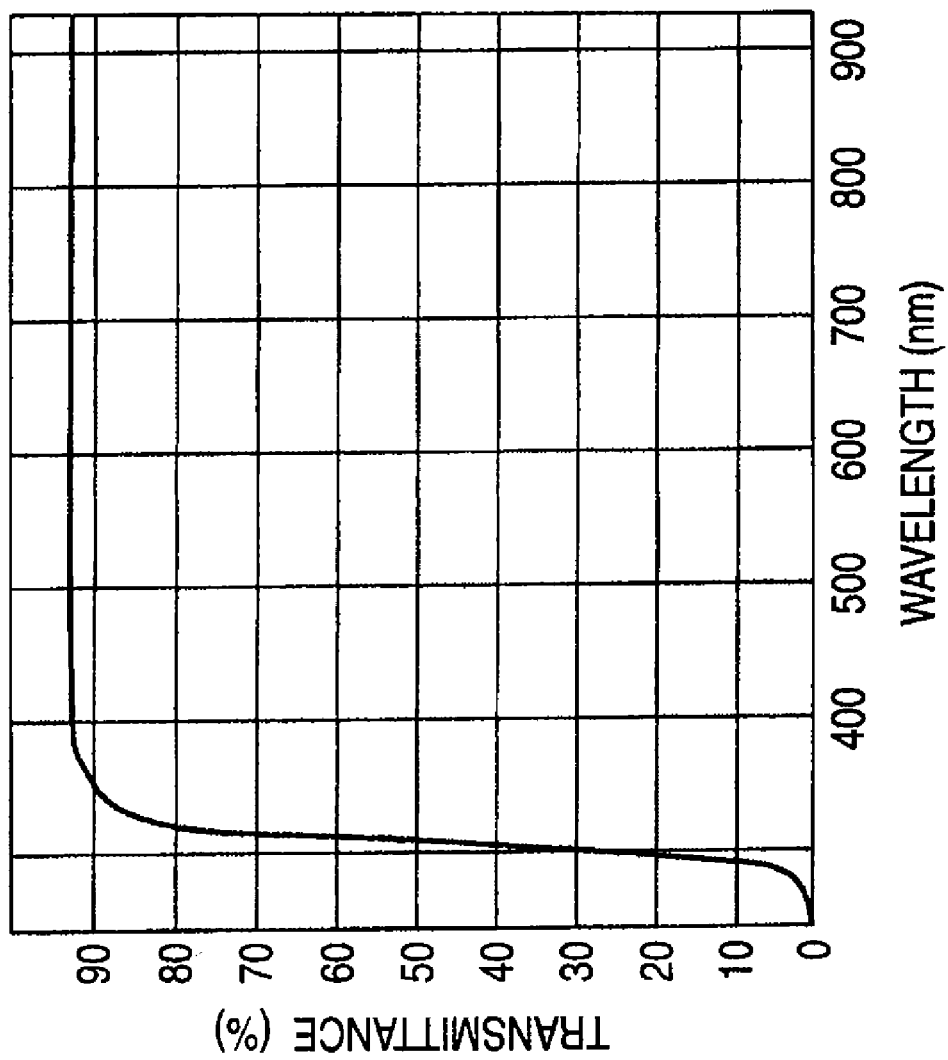
FIG. 3 is a transmission spectrum to show transparency of a visible light region of a resin as an α-ray shielding layer to be used in a solid-state imaging apparatus according to Example 2.

FIG. 3 is a transmission spectrum to show transparency of a visible light region of a resin as an α-ray shielding layer to be used in a solid-state imaging apparatus according to the present Example 2.

In FIG. 3, the abscissa stands for a wavelength of light; and the ordinate stands for a transmittance. With respect to the resin A, the measurement was carried out at a layer thickness of 15 μm.

From FIG. 3, a high transmittance of 90% or more was exhibited in a wide range including a visible region of light wavelength of from 400 nm to 900 nm, and transparency of a visible light region was exhibited.

Second Embodiment

Figure 4:
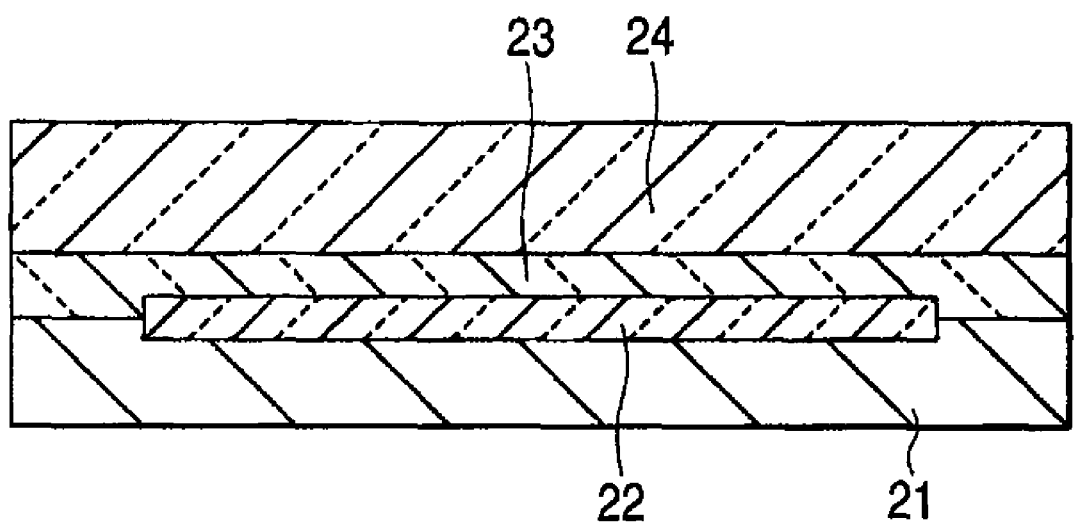
FIG. 4 is a schematic cross-sectional view of a solid-state imaging apparatus according to Second Embodiment.
Figure 5:
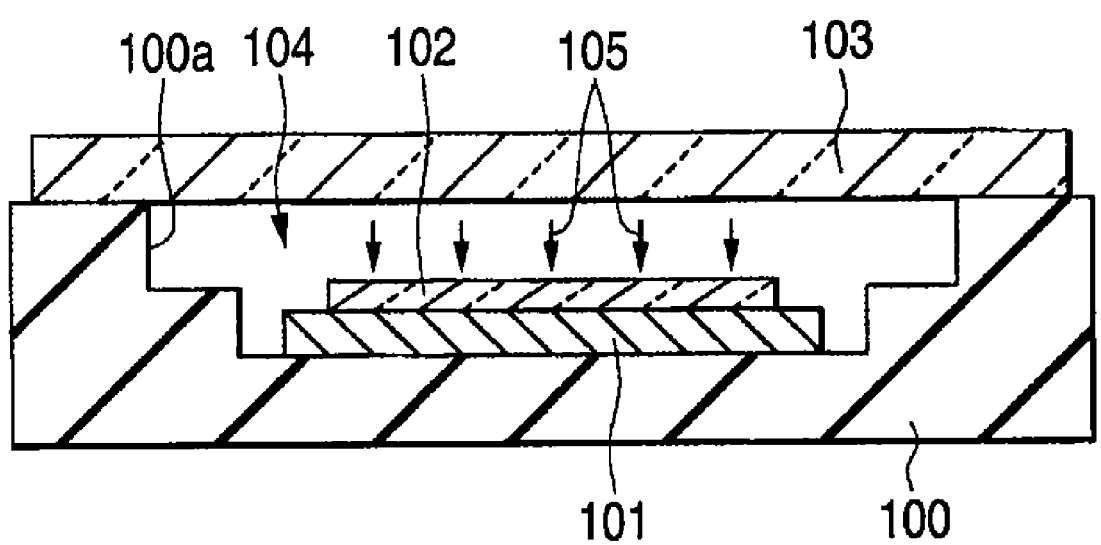
FIG. 5 is a schematic cross-sectional view of a solid-state imaging apparatus according to the related art.

FIG. 4 is a schematic cross-sectional view of a solid-state imaging apparatus according to the Second Embodiment.

A solid-state imaging apparatus according to the Second Embodiment includes, for example, a solid-state imaging device 21, an α-ray shielding layer 23 formed so as to cover at least an imaging area of the solid-state imaging device 21, and a cover glass 24 provided above the α-ray shielding layer 23.

Also, for example, a color filter 22 for reading out a color is provided on the surface of the solid-state imaging device 21 and in a lower layer of the α-ray shielding layer 23.

The solid-state imaging apparatus according to the present Second Embodiment does not use a package as in the First Embodiment, has a configuration in which the solid-state imaging device 21 having the color filter 22 provided on the surface thereof and the cover glass 24 are stuck to each other via the adhesive α-ray shielding layer 23 and becomes so-called CSP (chip size package).

For example, though the cover glass 24 is formed so as to have a size substantially equal to the solid-state imaging device 21, it may be larger or smaller than the solid-state imaging device 21.

With respect to the solid-state imaging device 21, the color filter 22, the α-ray shielding layer 23 and the cover glass 24, ones the same as those described in the First Embodiment can be used, respectively.

In the solid-state imaging apparatus according to the Second Embodiment, by providing the α-ray shielding layer between the cover glass and the solid-state imaging device, the α-ray shielding layer is also able to decay the quantity of the α-rays emitted from the cover glass and to decrease largely the quantity of α-rays reaching the solid-state imaging device, whereby the generation of a defect caused upon exposure of the imaging area of the solid-state imaging device to α-rays can be inhibited.

Also, as described previously, since it is enough that a high-purity raw material is not used as the cover glass, a cover glass made of a cheap material can be employed.

In the light of the above, the Second Embodiment is to provide a solid-state imaging apparatus with improved reliability while reducing the costs.

According to the First Embodiment and Second Embodiment, the following effects are observed.

(1) The generation of a crystal defect or the like of a solid-state imaging device caused due to α-rays from a cover glass can be suppressed, whereby the quality of an image to be imaged is not hindered.

(2) Since it is not necessary to use an expensive cover glass using a high-purity material which is less in radioactive substances, the costs of a cover glass can be largely reduced.

(3) A solid-state imaging device is constituted so as to have a structure in which dew condensation is hardly generated, whereby the hermetic quality can be improved.

(4) Since a resin is filled in a hollow portion of a package, thereby increasing the strength of a structure, the thickness of each of a cover glass, a solid-state imaging device and a package can be made thin. Accordingly, thinning of the whole of a solid-state imaging apparatus can be realized.

It should be appreciated that the embodiment, described above are not limited to the foregoing examples.

For example, substances other than the resin may be used as the material constituting the α-ray shielding layer. So long as the solid-state imaging device has been subjected to a waterproof treatment or the like, even if it is filled with a liquid such as water, the same effects can be obtained.

For example, in the case of a resin, a thickness of the α-ray shielding layer is 20 μm or more, and preferably, for example, 23 μm or 25 μm or more. However, it is also possible to form the α-ray shielding layer in a thickness of not more than 20 μm depending upon required levels of the degree of shielding of α-rays.

So long as an embodiment is concerned with a solid-state imaging apparatus in which an α-ray shielding layer having a thickness of 20 μm or more and made of a resin which is transparent in a visible region of light wavelength or the like is provided between a solid-state imaging device and a cover glass, it is applicable to all of systems without being limited to the foregoing examples.

In the foregoing embodiment, though the cover glass is used as a translucent member opposing to the solid-state imaging device, plastic materials which meet the foregoing conditions of an embodiment and which are excellent in heat resistance and humidity resistance and can also be used as the translucent member in place of the cover glass.

The solid-state imaging apparatus according to an embodiment is applicable a solid-state imaging apparatus installed with a CCD sensor, a CMOS sensor, an area sensor, a linear sensor, or the like.

It should be understood that various changes and modifications to the presently preferred embodiments described herein will be apparent to those skilled in the art. Such changes and modifications can be made without departing from the spirit and scope of the present subject matter and The invention is claimed is:

1. A solid-state imaging apparatus comprising:
   a solid-state imaging device having:
   (a) an imaging area; and
   (b) a first surface;
   an α-ray shielding layer formed to cover at least the imaging area of the solid-state imaging device;
   a color filter having a second surface, said second surface being different from said first surface, said color filter being disposed on said first surface of said solid-state imaging device, said α-ray shielding layer being disposed on said second surface of said color filter, said color filter being separate from said α-ray shielding layer; and
   a cover glass provided above the α-ray shielding layer.

2. The solid-state imaging apparatus according to claim 1, wherein
   the solid-state imaging device is arranged within a recess of a recess-provided package,
   the α-ray shielding layer is formed to bury the recess therein, and
   the cover glass is provided to seal the recess.

3. The solid-state imaging apparatus according to claim 1, wherein the solid-state imaging device and the cover glass are adhered to each other via the active α-ray shielding layer.

4. The solid-state imaging apparatus according to claim 1, wherein the α-ray shielding layer is made of a substance having a density of $1.0 \text{ g/cm}^3$ or more.

5. The solid-state imaging apparatus according to claim 1, wherein the α-ray shielding layer is substantially transmissive against light having a wavelength in the visible region.

6. The solid-state imaging apparatus according to claim 4, wherein the α-ray shielding layer has a transmittance of 90% or more against light having a wavelength in the visible region.

7. The solid-state imaging apparatus according to claim 1, wherein the α-ray shielding layer has adhesiveness to the cover glass.

8. The solid-state imaging apparatus according to claim 1, wherein the α-ray shielding layer is made of a resin.

9. The solid-state imaging apparatus according to claim 8, wherein the α-ray shielding layer has a thickness of 20 μm or more.

10. The solid-state imaging apparatus according to claim 8, wherein the resin includes an acrylic resin, an epoxy resin or a silicone resin.

11. The solid-state imaging apparatus according to claim 1, wherein the color filter is provided in a lower layer of the α-ray shielding layer.

12. The solid-state imaging apparatus according to claim 8, wherein the resin includes an acrylic resin.

13. The solid-state imaging apparatus according to claim 8, wherein the resin includes a silicone resin.

14. The solid-state imaging apparatus according to claim 1, wherein a color filter is provided on a surface of the solid-state imaging device and a separate α-ray shielding layer is provided on a surface of the color filter.

* * * * *